United States Patent
Beaulieu et al.

(10) Patent No.: US 6,414,386 B1
(45) Date of Patent: Jul. 2, 2002

(54) METHOD TO REDUCE NUMBER OF WIRE-BOND LOOP HEIGHTS VERSUS THE TOTAL QUANTITY OF POWER AND SIGNAL RINGS

(75) Inventors: Frederic Beaulieu, Brossard (CA); Mark J. Kuzawinski, Maine, NY (US); Stephane Mainville, Bromont (CA); Sylvain Ouimet, St-Hubert (CA); Jean-Guy Quintal, Canton de Granby (CA); Guy Robichaud, Granby (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/531,971

(22) Filed: Mar. 20, 2000

(51) Int. Cl.[7] .......................... H01L 23/52; H01L 23/48
(52) U.S. Cl. ...................... 257/691; 257/784; 257/787
(58) Field of Search ................ 257/692, 666, 257/678, 668, 698, 688, 687, 695, 781, 784, 691, 776, 787; 438/614, 617

(56) References Cited

U.S. PATENT DOCUMENTS

| | | | | |
|---|---|---|---|---|
| 5,235,209 A | * | 8/1993 | Shimizu et al. | 257/692 |
| 5,530,287 A | * | 6/1996 | Currie et al. | 257/692 |
| 5,556,807 A | * | 9/1996 | Bhattacharyya et al. | 438/123 |
| 5,777,265 A | * | 7/1998 | Bhattacharyya et al. | 174/52.4 |
| 5,796,589 A | * | 8/1998 | Barrow | 361/813 |
| 5,841,191 A | * | 11/1998 | Chia et al. | 257/691 |
| 5,903,050 A | * | 5/1999 | Thurairajaratnam et al. | 257/695 |
| 6,031,283 A | * | 2/2000 | Banerjee et al. | 257/698 |
| 6,057,601 A | * | 5/2000 | Lau et al. | 257/738 |
| 6,137,168 A | * | 10/2000 | Kirkman | 257/691 |

FOREIGN PATENT DOCUMENTS

JP  4-127564  * 4/1992 .................. 257/666

* cited by examiner

Primary Examiner—Jasmine J B Clark
(74) Attorney, Agent, or Firm—Scully, Scott, Murphy & Presser; Lawrence R. Fraley, Esq.

(57) ABSTRACT

A method for reducing the number of wire-bond loop heights which are required in comparison with a total quantity of power and signal rings employed in low profile wire-bond integrated circuit packages. There are also provided low profile wire-bond packages which are produced in accordance with the method pursuant to the invention.

7 Claims, 3 Drawing Sheets

METHOD TO REDUCE NUMBER OF WIRE-BOND LOOP HEIGHTS VERSUS THE TOTAL QUANTITY OF POWER AND SIGNAL RINGS

BACKGROUND OF THE INVENTION

1. Field of the Invention

The present invention relates to a method for reducing the number of wire-bond loop heights which are required in comparison with a total quantity of power and signal rings employed in low profile wire-bond integrated circuit packages. Moreover, the invention is further directed to the provision of low profile wire-bond packages which are produced in accordance with the method pursuant to the invention.

Generally, low profile wire-bond integrated circuit or printed circuit wire-bond packages are intended to be designed so as to meet standards which have been set by the JEDEC (Industry Society Joint Electron Device Engineering Council) defining low-profile design outlines specifying package height restrictions, such as the height to which a wire-bond wire may extend or loop above a package substrate. This particular height limitation in the formation of the wire loops is normally imposed either through the assembled distance between the laminate of the substrate and the mounting card or chip (cavity parts) or the encapsulation mold fixture and the laminate (for chip-up package parts). Basically, these industry standards defining the height limitations of wire-bond wire loops are applicable to both the so-called cavity-down plastic ball grid arrays (PBGA) or chip-up packages.

Ordinarily, each different wire-bond wire length extending in a horizontal direction, when employed in a low-profile wire-bond package and forming a vertically rising wire loop, must be separated so as to be adequately spaced in its vertical extent or orientation from other wire-bond wire loops or lengths of the package in order to prevent the occurrence of possible electrical shorts and other potential damage which can be readily encountered during the assembly of the wire-bond package, and attempts to avoid such difficulties may result in the exceeding of maximum allowable encapsulation package heights depending upon the number of wire loop heights employed.

For instance, an integrated circuit chip with a single row of wire-bond pads which is wired to a substrate with a ground ring, voltage ring and signal ring may result in three loops, each increasing in loop height as defined by the wires of the formed package. In the event that the chip pads are staggered, such as through the use of two voltage, one ground and two signal rings, this may provide for a total of five increasing loop heights. Consequently, by way of example, if each loop is separated by a distance or vertical spacing of 75 microns, the resulting vertical height of the upper-most wire for a three loop wire-bond structure would potentially measure 225 microns; whereas, for a five-loop structure this overall vertical wire loop height may measure up to 375 microns. Thus, an addition of the thickness of an encapsulant over the wire loops, can be an increase of an additional height of 200 microns of material above the package substrate, resulting in a total height of approximately 425 microns for a three wire-loop arrangement, and of up to 575 microns for a five wire-loop package design.

However, pursuant to current JEDEC industry standards specifying the limits of encapsulation height measured from the module for cavity down parts of wire-bond packages are set to 470 microns for a 1.27 mm grid, and 381 microns for a 1 mm grid. Consequently, although the wire bonds may fit within the maximum specified package height limits, current assembling installations are unable to produce the package modules, inasmuch as the distance between the highest loop and the top or surface of the encapsulant may be too short to provide a satisfactory package construction.

Thus, a typical diameter for a solder ball (prior to reflow) utilized on a so-called cavity-down plastic ball grid array (PBGA) with a 1.27 mm grid is normally approximately 600 microns, and 500 microns for a 1 mm grid. However, production tolerances which are encountered during assembly must be accommodated within a 120 to 130 micron range in order to be able to properly connect the solder balls to the card or substrate employing the maximum specified encapsulation height as set forth hereinabove in compliance with the industry standards.

2. Discussion of the Prior Art

At this time, industry manufacturing practices which are intended to solve the problem of managing constraints in the overall height of the plurality of encapsulated wire-bond loops in forming the low-profile wire-bond integrated circuit packages, are equally applicable to cavity-down ball grid array (BGA) and chip-up packages, such as but not limited to land grid arrays (LGAs) designed to JEDEC low profile outline standards, whereby package height restrictions necessitate wire loop heights and encapsulating thicknesses to be produced to closer dimensions, thereby resulting in possible yield or output losses. The yield losses are encountered, inasmuch as the wires are not spaced apart to an adequate extent relative to each other so as to prevent shorting of potentially at least some wires during encapsulation thereof. This is essentially an unacceptable limitation in the manufacture of low-profile wire bond packages. Further problems are encountered which would render the arrangements unacceptable and unworkable in nature when confronted with smaller diameter solder balls utilized for JEDEC standard BGA pitches of 1 mm and less, which further reduces any space or height available from the printed circuit board to the encapsulant.

SUMMARY OF THE INVENTION

In order to overcome the problems which are encountered in the present state-of-the-technology pertaining to the manufacture of low-profile wire-bond packages, the present invention reduces the excessive heights of low-profile wire-bond packages by essentially reducing the number of wire-bond loops versus the total quantity of power and signal rings employed. The foregoing height reduction is achieved in that the number of wire loops for various package constructions are reduced by creating an interstitial pattern of ground and power buses with a separate signal wire-bond ring arranged on the substrate. The significant advantages which are attained through the foregoing resides in a reduction of wire-bond loops in comparison with present low-profile wire-bond packages, resulting in reduced overall loop height so as to enable fabrication of a low-profile encapsulated package which meets industry requirements for both chip-up and low-height cavity-down wire-bond packages.

Accordingly, it is an object of the present invention to provide a novel method for reducing the height of a wire-bond package through a reduction in the number of wire-bond loops which are required versus the total quantity of power and signal rings utilized in the package.

Another object of the invention resides in the provision of the method for reducing the overall height of wire-bond packages both as to cavity-down ball grid array or chip up packages by reducing the number of wire loops versus the total quantity of power and signal rings through the formation of an interstitial pattern of ground and power buses.

A further object of the present invention is to provide a novel low profile wire-bond package possessing a reduced number of wire-bond loops versus the total quantity of power and signal rings so as to reduce the overall height of the package.

A still further object of the present invention is to provide an arrangement of a low profile wire-bond package providing a reduced number of wire-bond loops through a novel construction incorporating an interstitial pattern of ground and power buses with a separate signal wire bond ring on a substrate of the low-profile wire-bond package.

BRIEF DESCRIPTION OF THE DRAWINGS

The foregoing advantages and novel features of the invention directed to a reduction in wire-bond loop height versus the total quantity of power and signal rings of a low-profile wire-bond package are now described in further detail hereinbelow, with reference to the accompanying drawings; in which.

DETAILED DESCRIPTION OF PREFERRED EMBODIMENTS

Figure 1:
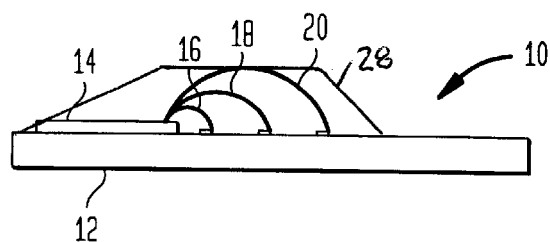
FIGS. 1 and 2 are, respectively, cross-sectional side and top plan views of a low-profile chip-up wire-bond package utilizing three wire loops, constructed in accordance with the current state of the technology.
Figure 2:
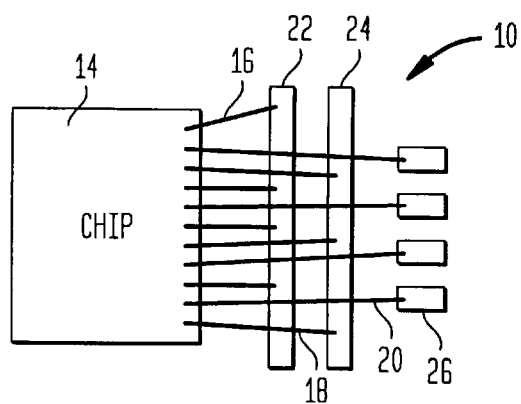

Referring now specifically to the drawings representing the prior art construction of a three-loop high wire-bond package 10 pursuant to FIGS. 1 and 2, there is illustrated a substrate 12 having a semiconductor chip 14 positioned thereon. The package has three wire loops 16,18 and 20 of increasing heights which, respectively, connect the chip 14 to three power, ground and signal rings 22,24 and 26. The chip and wire loop arrangement is then encapsulated by a suitable encapsulant 28 to form a package of a predetermined overall height. The particular chip-up package construction presents the manufacturing problems encountered by the need to provide for an overall package height within the limits specified by the JEDEC, as set forth hereinabove, and which necessitates that the three loop heights be limited so as to be more closely confined within the encapsulant, thereby leading to potential shorts and yield losses, frequently rendering the package unacceptable for use.

Figure 3:
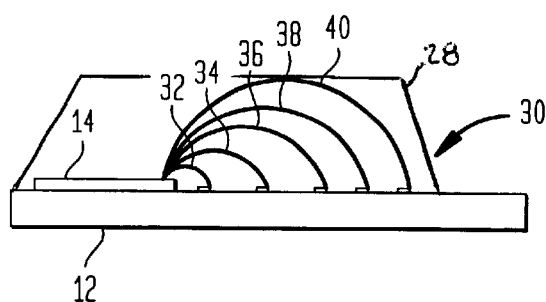
FIGS. 3 and 4 are respectively, cross-sectional side and top plan views of a low-profile chip-up wire-bond package utilizing five loop heights, constructed in accordance with the current state of the technology.
Figure 4:
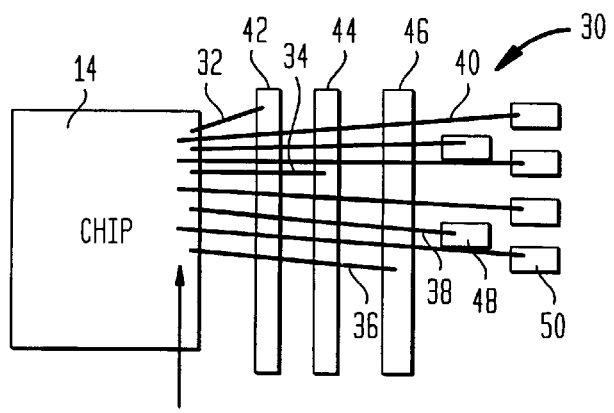

Similarly, referring to FIGS. 3 and 4 of the drawings, in which components which are identical with those shown in FIGS. 1 and 2 are identified by the same reference numerals, in this instance the chip-up wire-bond package 30 includes five wire loops 32,34,36,38 and 40 of increasing heights, wherein these are connected to, respectively, five power, ground and signal rings 42,44,46,48 and 50, as shown in FIG. 4 of the drawings, with staggered rows of bond fingers and bond pads. Also in this instance, the necessity for maintaining the overall height of the package 30 within limits as specified by JEDEC, subsequent to the chip and wire loops being encapsulated with an encapsulant 52, necessitates the height and superimposed five wire loops to be more closely confined, potentially resulting in shorting and resultant losses in output or yield.

Figure 5:
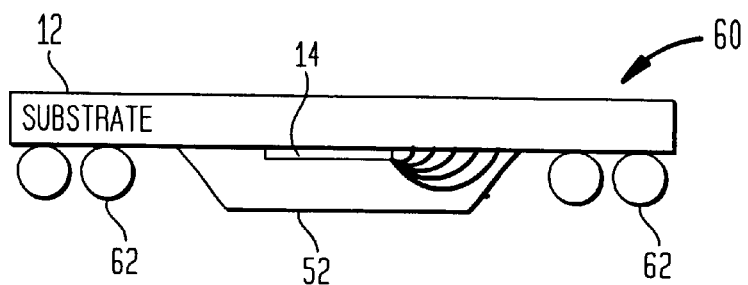
FIG. 5 illustrates a cross-sectional side view of a five loop wire-bond structure shown in a cavity down plastic ball grid array (PBGA) package.

As shown in FIG. 5 of the drawings, this construction of the package 60 is substantially analogous to the embodiment of FIGS. 3 and 4, however, in this instance, the package is a chip-down package, mounting a cavity-down plastic ball grid array (PBGA) 62 which is intended to be designed to conform to the JEDEC or low-profile guidelines with regard to package height restrictions. However, as in the chip-up package 30 of FIGS. 3 and 4, wherein this embodiment is also equipped with five wire-bond loops, the overall height restriction necessitates the encapsulation to cause these wire loops to be pressed together so as to be more closely spaced in a vertical orientation or height, and resulting in possible shorting and losses in yield or output.

Figure 6:
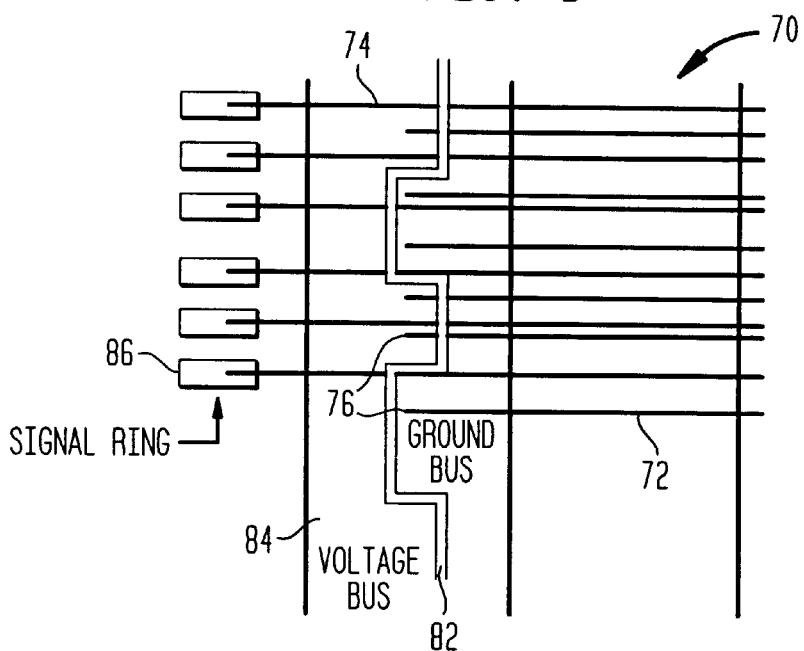
FIGS. 6 and 7 illustrate, respectively, bottom plan and cross-sectional views of a first embodiment of the invention illustrating the preceding three loop heights of FIGS. 1 and 2 as having been reduced two loops so as to produce a lower-profile package.
Figure 7:
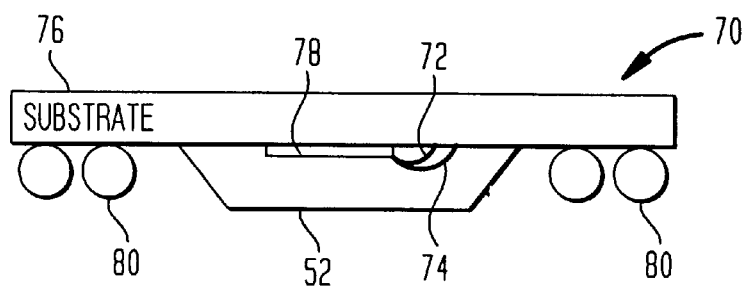

The problems which are elucidated hereinabove are essentially overcome by the present inventive low-profile package constructions. In the embodiment shown in FIGS. 6 and 7 there is disclosed a thinner low-profile wire-bond package 70 which improves upon the prior art three-loop package design of FIGS. 1 and 2. In this instance, the wire loops are reduced to two loops 72,74 rather than the previous three wire loops, with the substrate 76 and the chip 78, being represented as a cavity-down package with ball grid arrays (BGAs) 80, although the invention is equally applicable to chip-up packages. As shown in FIG. 6, an interstitial pattern of a ground bus 82 and a power bus 84 is located on the substrate 76, with a separate signal wire bond ring 86. This arrangement of ground and power buses 82,84 allows for a single row of wire-bond connections directly on the substrate, mimicking a single ring. This novel construction thus eliminates a wire loop, and enables the entire package structure to be provided with the two loops 72,74 rather than the previous three loops whereby encapsulation by the encapsulant 88 enables the application of a more desirable amount of material in view of the lesser wire loop height. Consequently, the overall package height has been significantly reduced and desired wire-bond loop spacing can be maintained without any potential loss or shorting of power, so as to meet JEDEC package height standards.

Figure 8:
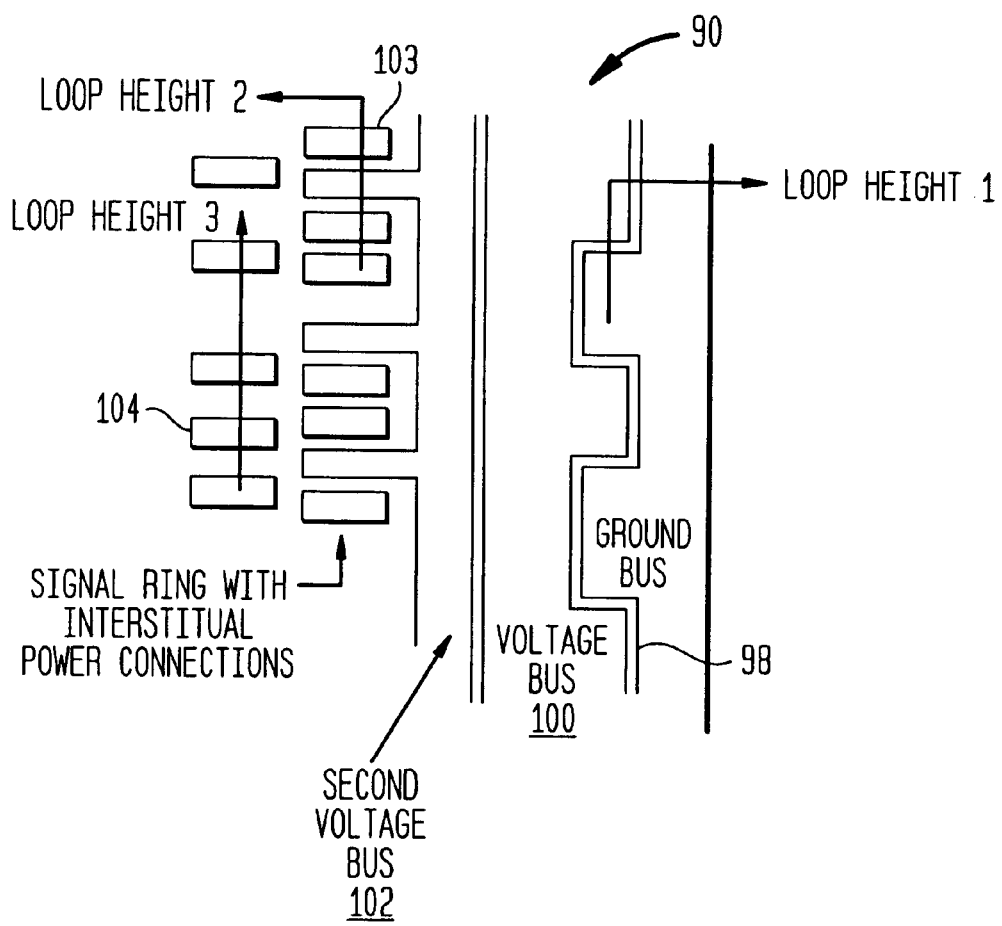
FIGS. 8 and 9 illustrate, respectively, bottom plan and cross-sectional side views of a low-profile wire loop package construction in which the preceding five-loop height design of FIGS. 3 to 5 has been reduced to three loops to form a lower package in accordance with the present invention.
Figure 9:
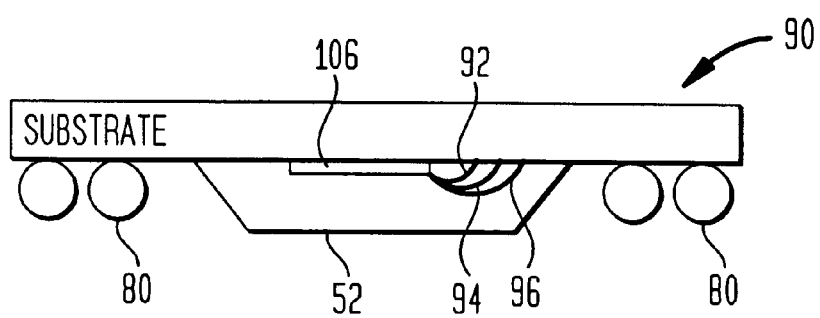

Similarly, reverting to the embodiment of FIGS. 8 and 9 of the drawings; in that instance the typical five wire-loop package shown in FIGS. 3 to 5, has been redesigned to a package 90 with only three wire-loops 92,94 and 96; in effect, eliminating two wire loops by creating an interstitial pattern of a ground bus 98 and two power or voltage buses 100,102, and signal ring 103 with a separate signal ring 104 with interstitial connections. Thus, one of the loops 92 is connected to the ground bus 98 in the plane of the chip 106, whereas second loop 94 is connected to the signal ring with interstitial power connections, and the third loop 96 is connected to the separate signal ring.

The advantage of the embodiment of FIGS. 8 and 9 resides in that the previous five-loop height is reduced to only three loops, thereby enabling a more desirable encapsulation, which meets the industry requirements for producing slimmer chip-up and cavity-down low-profile wire-bond packages; for instance, such as for the JEDEC 1 mm grid mentioned hereinabove.

From the foregoing, it becomes readily apparent that the advantages of the present invention reside in enabling the fabrication of lower height wire-bond packages, which eliminate portions in the amount of the wire loops and resultingly reduce overall loop height requirements, while maintaining the integrity and operative advantages of previous wire-bond packages within the particular size and height parameters specified by industry standards.

Although there have been described the advantages derived over previous three wire loops and five wire loop wire-bond package designs by reducing the number of wires versus total quantity of power and signal rings, thereby reducing package thickness, it is possible to contemplate the advantages of the invention being applicable to low-profile wire-bond packages having different numbers of wire loops as may be required by specific applications, these features being advantageous to both chip-up and cavity-down package designs.

While the invention has been particularly shown and described with respect to preferred embodiments thereof, it will be understood by those skilled in the art that the foregoing and other changes in form and details may be made therein without departing form the spirit and scope of the invention.

What is claimed is:

1. In a wire-bond package arrangement including a substrate; at least one semiconductor chip mounted on said substrate; and at least one each of a power ring, a ground ring and a signal ring at the height of the substrate surfaces mounting said at least one chip being operatively connected to circuitry on said chip by wires; the improvement comprising:

a) said at least one power ring and ground ring being located in an interstitial pattern on the surface of said substrate;

b) a first wire extending within a vertical height between the surface of the substrate and the surface of said chip said wire commonly interconnecting said interstitial pattern formed by said at least one power and ground ring with circuitry on said chip; and c) a second wire extending in a vertical loop spaced above said first vertical wire loop and interconnecting circuitry on said chip with said at least one signal ring.

2. A wire-bond package arrangement as claimed in claim 1, wherein said chip, and said first and second wires on said substrate are encapsulated with an encapsulant so as to form a low-profile wire-bond package arrangement of specified overall height.

3. A wire-bond package arrangement as claimed in claim 1, wherein said at least one power ring comprises a voltage bus and said at least one ground ring comprises a ground bus, wherein the interstitial pattern of said buses enables the provision of a single row of wire-bond connections on the substrate to simulate a single ring.

4. A wire-bond package arrangement as claimed in claim 2, wherein said arrangement comprises a chip-up package having a reduced height wire loop to facilitate forming of an increased thickness of an encapsulant over said chip wires while maintaining the overall height of said package arrangement within specified parameters.

5. A wire-bond package arrangement as claimed in claim 2, wherein said arrangement comprises a cavity-down plastic ball grid array package having a reduced height of wire loop to facilitate forming of an increased thickness of encapsulant over said chip and wires while maintaining the overall height of said package within specified parameters.

6. A wire-bond package arrangement as claimed in claim 3, wherein there is provided a second voltage bus; and a second signal wire-bond ring with interstitial power connections facilitating the connection thereof with circuitry on said chip through a second wire loop formed by a third wire extending in elevation spaced above said second wire forming said first wire loop.

7. A wire-bond package arrangement as claimed in claim 6, wherein said chip, said first wire and said first and second wire loops formed by said second and third wire-bond wires are encapsulated with an encapsulant so as to form a low-profile wire-bond package of specified overall height.

* * * * *